United States Patent [19]

Kawakami et al.

[11] Patent Number: 5,625,312
[45] Date of Patent: Apr. 29, 1997

[54] CONTROL CIRCUIT FOR SEMICONDUCTOR DEVICE

[75] Inventors: Hiroyuki Kawakami; Noriho Terasawa, both of Kawasaki, Japan

[73] Assignee: Fuji Electric Co., Ltd., Kanagawa, Japan

[21] Appl. No.: 496,243

[22] Filed: Jun. 28, 1995

[30] Foreign Application Priority Data

Jun. 29, 1994 [JP] Japan .................................. 6-147222

[51] Int. Cl.$^6$ ................................................ H03K 17/615
[52] U.S. Cl. ........................ 327/483; 327/109; 327/267; 327/287
[58] Field of Search ................................ 327/109, 483, 327/287, 267, 266

[56] References Cited

U.S. PATENT DOCUMENTS 4,618,782  10/1986  Lang et al. .......................... 327/483

FOREIGN PATENT DOCUMENTS 000184402  6/1986  Japan .................................. 327/109

Primary Examiner—Margaret Rose Wambach
Attorney, Agent, or Firm—Finnegan, Henderson, Farabow, Garrett & Dunner, L.L.P.

[57] ABSTRACT

A control circuit for an insulated-gate semiconductor device (IGBT) 1 has a drive circuit 2, which is a series circuit constructed of an npn transistor 3 and a pnp transistor 4, and controls the switching operation of the IGBT 1 in response to an on/off signal 9S from a switching signal source 9. The control circuit includes a switching speed control means 10, a gate potential stabilizing npn transistor 20, and a stable operation extending means 30. The switching speed control means 10 gives predetermined slops to the rise and fall of the on/off signal 9S. The gate potential stabilizing npn transistor 20 is Darlington-connected to the pnp transistor 4 of the drive circuit 2 and has the emitter thereof connected to the source of the IGBT 1. The stable operation extending means 30 generates an on signal to the base of the gate potential stabilizing npn transistor 20 upon sensing a drop in the gate potential of the IGBT 1 to a threshold voltage thereof or less.

6 Claims, 2 Drawing Sheets

CONTROL CIRCUIT FOR SEMICONDUCTOR DEVICE

BACKGROUND OF THE INVENTION

1. Field of the Invention

This invention relates to a control circuit for an insulated-gate semiconductor device such as a power MOSFET and an IGBT used as a switching element in motor driving inverters.

2. Description of the Related Art

FIG. 1 is a diagram showing in simplified form the configuration of a conventional control circuit of a semiconductor device. The control circuit connected to the gate of an IGBT 1 serving as an insulated-gate semiconductor device has a drive circuit 2 that is a series circuit constructed of an npn transistor 3 and a pnp transistor 4. The collectors of both transistors 3 and 4 are connected to a not shown control power supply so that a control voltage $V_{CC}$ is applied thereto, and the bases thereof connected in parallel to each other are connected to a switching signal source 9 so that an on/off signal 9S is received. Further, the emitters connected in parallel to each other are connected to the gate of the IGBT 1 through a gate series resistor 5. As a result of such configuration, a drive voltage 2S outputted to the side of the emitters in correspondence to the on/off signal 9S controls the IGBT 1 so as to turn on and off.

That is, when the on/off signal 9S from the switching signal source 9 is switched into an on signal, the npn transistor 3 turns on and the pnp transistor 4 turns off, causing the emitter voltage of the npn transistor 3 to increase to the control power supply voltage $V_{CC}$. Therefore, the gate voltage of the IGBT 1 is charged in accordance with a time constant determined by the product of the capacitance between the gate and the emitter and the resistance of the gate series resistor 5. When the gate voltage has exceeded the threshold voltage, the IGBT 1 turns on, thereby allowing a main circuit current $I_{CO}$ to flow between the drain and source of the IGBT 1. Further, when the on/off signal 9S is switched into an off signal, the npn transistor 3 turns off, causing the emitter voltage to drop from the control power supply voltage $V_{CC}$ to zero. Therefore, the gate voltage of the IGBT 1 is discharged in accordance with the time constant determined by the product of the capacitance between the gate and the emitter and the resistance of the gate series resistor 5. When the gate voltage has dropped below the threshold voltage, the IGBT 1 turns on, thereby blocking the main circuit current $I_{CO}$ flowing between the drain and source of the IGBT 1. The IGBT 1 remains turned off until an on signal is outputted from the switching signal source 9 again.

In the conventional control circuit, when the on/off signal 9S outputted from the switching signal source 9 is an off signal and when the IGBT 1 is therefore turned off, the gate voltage of the IGBT 1 is gradually increased by the charges stored through not only the capacitance with respect to the collectors but also the stray capacitance at the gate (hereinafter referred to as the "charges stored by gate capacitive coupling"). At this instance, the pnp transistor 4 remains turned off, so that the charges stored at the IGBT 1 by the gate capacitive coupling tend to be discharged to the ground in FIG. 1 through the gate series resistor 5 and the pnp transistor 4. However, being restricted by the fact that the pnp transistor 4 has a higher saturation voltage than the threshold voltage of the IGBT 1 and that the direct current amplifying rate cannot be increased, the stored charges are not sufficiently discharged, which in turn causes the gate potential of the IGBT 1 to gradually increase, and when this potential has exceeded the threshold voltage of the IGBT 1, the IGBT 1 erroneously turns on. This is a problem.

Further, when the discharge current from the gate of the IGBT 1 flows to the gate series resistor 5, a voltage drop occurs at the gate series resistor 5, and the voltage drop causes the gate potential of the IGBT 1 to increase, thereby making it likely to erroneously turn on the IGBT 1. In order to block this potential increase, it is necessary to set the resistance of the gate series resistor 5 to a small value. However, the small resistance leads to increasing the current decreasing speed $-dI_{CO}/dt$ at the time the IGBT 1 turns off, thereby increasing the turn-off surge voltage caused by such increase in the current decreasing speed. This not only makes it more likely to cause breakage of the IGBT 1 and the erroneous operation of the control circuit, but also causes a vicious circle of increasing the charges stored by gate capacitive coupling. Therefore, the resistance of the gate series resistor 5 cannot be decreased. This is another problem.

On the other hand, when the npn transistor 3 turns on and the pnp transistor 4 turns off by an on signal from the switching signal source 9, the gate potential of the IGBT 1 is increased in accordance with the time constant determined by the product of the resistance of the gate resistor 5 and the capacitance between the gate of the IGBT 1 and the emitter so that the IGBT 1 turns on. The current increasing speed $dI_{CO}/dt$ at the time the IGBT 1 has turned on is also determined by such time constant. However, if the charges stored by capacitive coupling is introduced into the gate of the IGBT 1, the gate potential increasing speed at the time the IGBT 1 turns on becomes higher than that defined by the time constant, which in turn increases the current increasing rate $dI_{CO}/dt$ at the time the IGBT 1 turns on. Hence, the forward surge voltage at the time the IGBT 1 turns on is increased and the control circuit is likely to operate erroneously. These are other problems.

SUMMARY OF THE INVENTION

An object of the invention is to provide a semiconductor device having a control circuit which is capable of controlling not only an increase in the gate potential caused by capacitive coupling but also a surge voltage within a small range so that the switching operation of an insulated-gate semiconductor device can be stabilized.

To achieve the above object, the invention is applied to a control circuit for a semiconductor device having a drive circuit and controlling switching of an insulated-gate semiconductor device, the drive circuit being a series circuit constructed of an npn transistor and a pnp transistor, collectors of the transistors being connected to a control power supply, bases of the transistors receiving an on/off signal from a switching signal source to output an on/off drive voltage to emitters thereof, the insulated-gate semiconductor device having a gate terminal thereof connected to an output of the drive circuit. Such control circuit includes: a switching speed control means for supplying the bases of the drive circuit with the on/off signal from the switching signal source while giving predetermined slopes to rise and fall of the on/off signal; a gate potential stabilizing npn transistor being Darlington-connected to the pnp transistor of the drive circuit and having an emitter thereof connected to a source of the insulated-gate semiconductor device; and a stable operation extending means for generating an on command to the base of the gate potential stabilizing npn transistor upon sensing a drop in gate potential of the insulated-gate semiconductor device to a threshold voltage of the gate potential or less.

The switching speed control means may include an npn transistor, a capacitor, and a constant current source, the npn transistor having a base thereof connected to the switching signal source and having a collector thereof connected to the bases of the drive circuit, the capacitor being inserted between the collector and the base of the npn transistor, the constant current source being inserted between the collector of the npn transistor and a control power supply.

The stable operation extending means may include a comparator, a gate circuit, and an npn transistor, the comparator outputting an on signal upon sensing a drop in the gate potential of the insulated-gate semiconductor device to the threshold voltage of the gate potential or less, the gate circuit generating an on signal in response to the on signal from the comparator and an off signal from the switching signal source, the npn transistor turning on in response to the on signal from the gate circuit and outputting a drive signal to the gate potential stabilizing npn transistor.

The npn transistor of the drive circuit and the gate potential stabilizing npn transistor may be Darlington transistors, respectively.

According to the invention, there is provided the switching speed control means that supplies an on/off signal from the switching signal source while giving slopes to the rise and fall of the on/off signal. Therefore, the function of controlling the surge voltage can be obtained by controlling both the current increasing speed at the time the insulated-gate semiconductor device turns on as well as the current decreasing speed at the time the insulated-gate semiconductor device turns off with the slopes given to the rise and fall of the gate pentothal of the insulated-gate semiconductor device.

In addition, the gate series resistor can be dispensed with, which in turn allows the potential drop caused at the gate series resistor to be eliminated by discharging the charges stored in the gate by capacitive coupling in the conventional example. Therefore, obtained is the function of eliminating not only an increase in the gate potential due to capacitive coupling but also instability in the operation of the drive circuit caused by such increase.

Further, according to the invention, there is provided the gate potential stabilizing npn transistor which is Darlington-connected to the pnp transistor of the drive circuit and whose emitter is connected to the source of the insulated-gate semiconductor device. Therefore, the gate potential stabilizing npn transistor turns on simultaneously with the turning off of the pnp transistor of the drive circuit at the time the insulated-gate semiconductor device has turned off, which in turn short-circuits the gate to the source of the insulated-gate semiconductor device. As a result, the charges stored by gate capacitive coupling can be discharged (taken out) to the emitter side. This provides not only the function of stabilizing the off operation of the insulated-gate semiconductor device by eliminating an increase in gate potential, but also a similar function when the insulated-gate semiconductor device turns on.

Still further, according to the invention, there is provided the stable operation extending means that generates an on command to the base of the gate potential stabilizing npn transistor upon sensing a drop in the gate potential of the insulated-gate semiconductor device to a threshold voltage of the gate potential or less. Therefore, the gate potential stabilizing npn transistor can be kept turned on by the stable operation extending means irrespective of the fact that the pnp transistor is turned off even while the insulated-gate semiconductor device remains turned off after the insulated-gate semiconductor device has turned off, thereby short-circuiting the gate to the source of the insulated-gate semiconductor device. As a result, the charges stored by electrostatic coupling at the gate can be discharged (taken out) to the emitter side, thereby providing the function of eliminating an increase in gate potential and therefore stabilizing the off operation of the insulated-gate semiconductor device.

According to the invention, there is formed the switching speed control means of a npn transistor, a capacitor, and a constant current source, the npn transistor having the base thereof connected to the switching signal source and the collector thereof connected to the base of the drive circuit, the capacitor being inserted between the collector and base of the npn transistor, the constant current source being inserted between the collector and a control power supply. Therefore, predetermined slopes can be given to the rise and fall of the on/off signal from the switching signal source in accordance with the time constant determined by a resistance equivalent to the constant current source and the capacitance of the capacitor. This hence provides the function of controlling the forward surge at the time the insulated-gate semiconductor device turns on as well as a turn-off surge by controlling the current increasing speed at the time the insulated-gate semiconductor device turns on and the current decreasing speed at the time the insulated-gate semiconductor device turns off.

According to the invention, there is implemented the stable operation extending means with a converter, a gate circuit, and an npn transistor, the converter outputting an on signal upon sensing a drop in the gate potential of the insulated-gate semiconductor device to a threshold voltage of the gate potential or less, the gate circuit generating an on signal in response to this on signal from the converter and an off signal from the switching signal source, the npn transistor turning on in response to the on signal from the gate circuit and thereby outputting a drive voltage to the gate potential stabilizing npn transistor. Therefore, while the insulated-gate semiconductor device remains turned off after having turned off, the stable operation extending means, substituting for the pnp transistor of the drive circuit that is turned off, applies the drive signal to the gate potential stabilizing npn transistor, so that the gate can be short-circuited to the source of the insulated-gate semiconductor device, thereby allowing the charges stored by gate capacitive coupling to be discharged (taken out) to the emitter side. As a result, the period during which the insulated-gate semiconductor device kept stably turned off can be extended by eliminating an increase in gate potential, thereby providing the function of preventing the insulated-gate semiconductor device form being erroneously turned on.

According to the invention, there is implemented the npn transistor of the drive circuit and the gate potential stabilizing npn transistor with Darlington transistors, respectively. Therefore, by taking advantage of the fact that the direct current amplifying rate of a Darlington transistor is larger than that of a single transistor, a large gate current can be fed to the insulated-gate semiconductor device, and the charges stored at the gate can be taken out with ease. Therefore, even if the insulated-gate semiconductor device has a large structure, the invention can provide the function of stabilizing the switching operation of the drive circuit by controlling the surge voltage while keeping the slope in the current change at the time the insulated-gate semiconductor device turns on and off and by blocking an increase in gate potential due to electrostatic capacitive coupling.

DETAILED DESCRIPTION OF THE PREFERRED EMBODIMENTS

Figure 1:
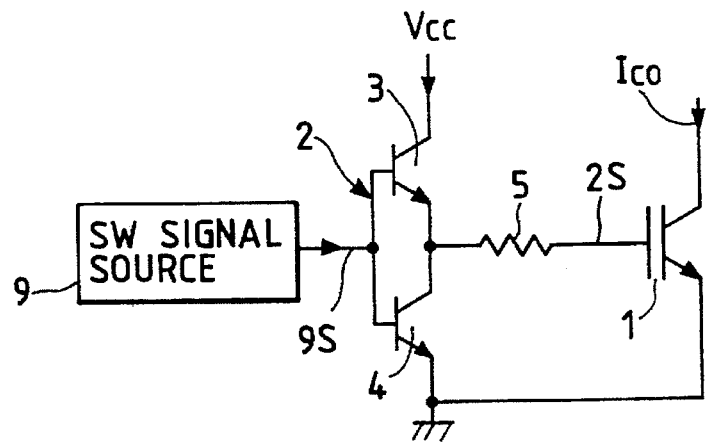
FIG. 1 is a diagram showing in simplified form the configuration of a conventional control circuit for a semiconductor device.
Figure 2:
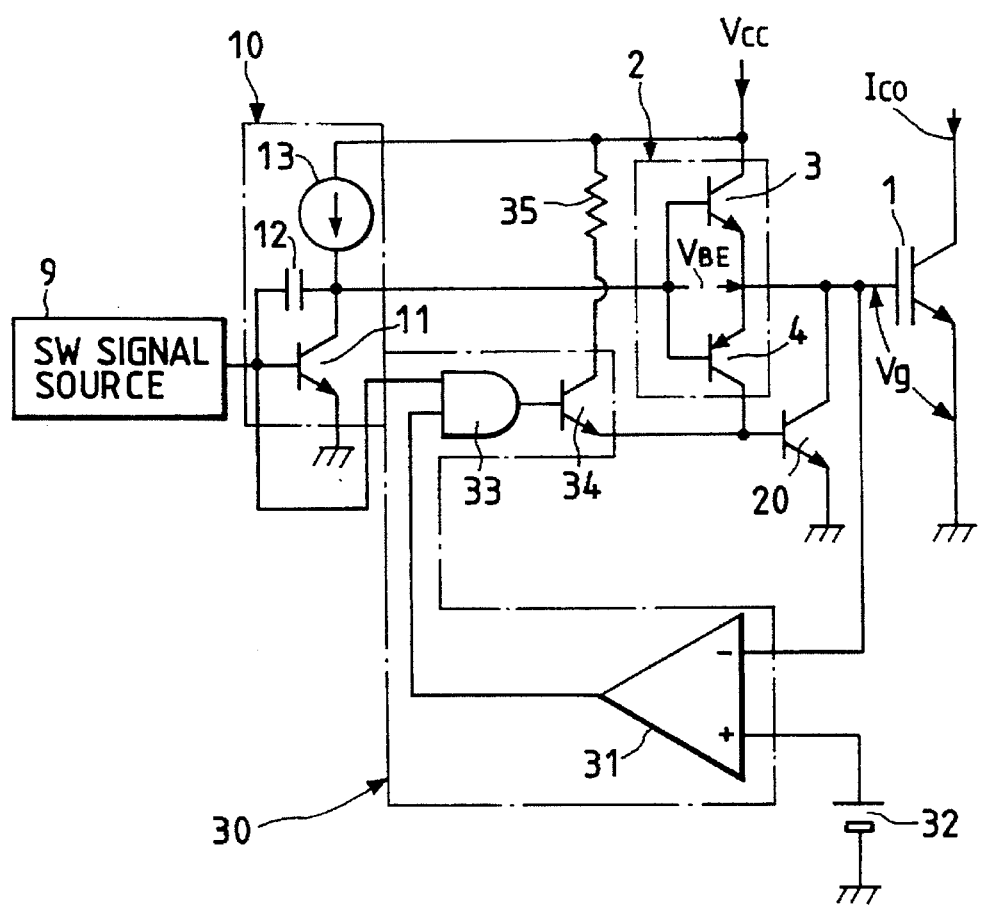
FIG. 2 is a diagram showing in simplified form the configuration of a control circuit for a semiconductor device according to an embodiment of the invention.

The invention will now be described with reference to embodiments. FIG. 2 is a diagram showing in simplified form the configuration of a control circuit for a semiconductor device, which is a first embodiment of the invention. Parts and components denoted as the same reference numerals as those of the conventional example have the same functions as those of the conventional example, and the description thereof will therefore be omitted. In FIG. 2, a control circuit for a semiconductor device has a drive circuit 2 and controls the switching of an insulated-gate semiconductor device 1, e.g., an IGBT. The drive circuit 2 is a series circuit consisting of an npn transistor 3 and a pnp transistor 4. The collectors of both transistors 3, 4 are connected to a not shown control power supply (voltage $V_{CC}$); the bases thereof receive an on/off signal 9S from a switching signal source 9; and the emitters thereof output an on/off drive voltage $V_g$. The insulated-gate semiconductor device (IGBT 1) is connected to the output of the drive circuit 2 through a gate terminal thereof. The aforementioned control circuit designed to control the IGBT 1 includes: a switching speed control means 10, a gate potential stabilizing npn transistor 20, and a stable operation extending means 30. The switching speed control means 10 supplies the bases of the drive circuit 2 with the on/off signal 9S while giving predetermined slopes to the rise and fall of the on/off signal 9S sent from the switching signal source 9. The gate potential stabilizing npn transistor 20 is Darlington-connected to the pnp transistor 4 for turning off the drive circuit 2 and has the emitter thereof connected to the source of the source of the IGBT 1. The stable operation extending means 30 generates an on signal to the base of the gate potential stabilizing npn transistor 20 upon sensing of the fall of the gate potential of the IGBT 1 to a level equal to or small than a threshold voltage of the IGBT 1.

The switching speed control means 10 according to the first embodiment includes an npn transistor 11, a capacitor 12, and a constant current source 13. The npn transistor 11 is such that the base thereof is connected to the switching signal source 9 and that the connector thereof is connected to the bases of the drive circuit 2. The capacitor 12 is inserted between the collector and base of the npn transistor 11. The constant current source 13 is inserted between the collector of the npn transistor 11 and a not shown control power supply. The switching speed control means 10 supplies the drive circuit 2 with the on/off signal 9S from the switching signal source 9 while giving predetermined slopes to the rise and fall of the on/off signal 9S based on a time constant determined by a resistor equivalent to the constant current source 13 and the capacitance of the capacitor 12.

The stable operation extending means 30 according to the first embodiment includes a comparator 31, a gate circuit 33, and an npn transistor 34. The comparator 31 compares the threshold voltage of the IGBT 1 which is set to a reference signal source 32 with the gate potential Vg of the IGBT 1 and outputs an on signal when the gate potential Vg has dropped below the threshold voltage. The gate circuit 33 generates an on signal in response to this on signal from the comparator 31 and an off signal from the switching signal source 9. The npn transistor 34 turns on in response to the on signal from the gate circuit 33 and outputs a drive signal to the base of the gate potential stabilizing npn transistor 20. By the collector of the npn transistor 34 being connected to a not shown control power supply through a resistor 35, the drive signal that rises to $V_{CC}$ from zero with the slope of the drive signal being regulated by a resistor 35 is prepared on the output side of the npn transistor 34.

Then, the operation of the thus configured control circuit for the semiconductor device will be described in sequence with reference to the cases where the IGBT 1 turns on, where the IGBT 1 turns off, and where the IGBT 1 is kept turned off. First, when the on/off signal 9S outputted from the switching signal source 9 is switched into an on signal that is low, the output of the gate circuit 33 that has received such on signal becomes off, and this also makes the npn transistor 34 turned off. As a result, the gate potential stabilizing npn transistor 20 also turns off. Simultaneously therewith, the npn transistor 11 turns off in response to the on signal 9S so that the switching speed control means 10 starts operating. As a result, the base voltage of the npn transistor 3 of the drive circuit 2 starts increasing from zero to $C_{CC}$ while holding such a slope as controlled by the switching speed control means 10. While the base voltage of the npn transistor 3 is increasing, the emitter of the npn transistor 3 starts increasing with the same slope as that of the base voltage thereof so as to hold the forward biased voltage that is lower by $V_{BE}$ than the base voltage. As a result, the npn transistor 3 tends to turn on. At this instance, a reverse voltage is applied across the base and emitter of the pnp transistor 4, and this not only causes the npn transistor 3 to turn off, but also keeps the gate potential stabilizing npn transistor 20 that is Darlington-connected to the pnp transistor 4 turned off. As a result, the gate and source of the IGBT 1 are open, which in turn causes the gate potential of the IGBT 1 to start increasing with the same slope as that of the base voltage of the npn transistor 3.

However, the gate of the IGBT 1 is to be charged by charges stored by gate capacitive coupling through a capacitance with respect to the drain of the IGBT 1 whose potential is higher than that of the gate or through a stray capacitance with respect to high potential components. Therefore, this tends to cause the gate potential to rise while anticipating the rise 0f the base potential of the npn transistor 3. If this happens, not only the npn transistor 3 is reverse-biased, leading to such instability as to cause the npn transistor 3 being in the course of turning on to turn off, but also the pnp transistor 4 is forward-biased, leading to such instability as to cause the pnp transistor 4 being in the course of turning off to turn on.

The gate potential stabilizing npn transistor 20 in the control circuit according to the first embodiment is designed to stabilize the switching operation of the gage circuit by eliminating such instabilities. That is, when the pnp transistor 4 being in the course of turning off returns to the on state, the gate potential stabilizing npn transistor 20 that has sensed such operation of the pnp transistor 4 instantaneously turns on to short-circuit the gate to the source of the IGBT 1. Therefore, the charges stored in the gate of the IGBT 1 by gate capacitive coupling are discharged through the path between the collector and the emitter of the gate potential stabilizing npn transistor 20. At this instance, the npn transistor 20, having a lower saturation voltage than the pnp transistor 4, can take out the stored charges out within a shorter period, thereby blocking the gate potential from increasing. When the pnp transistor 4 recovers the off state by returning to the reverse-biased state after the gate potential has dropped and the npn transistor 3 recovers to the on state by returning to the forward-biased state in association therewith, the gate voltage $v_g$ starts increasing again. Therefore, the instabilities at the drive circuit 2 can be controlled by the gate potential stabilizing npn transistor 20 repeating the aforementioned operation, which in turn provides an advantage that the turning on of the IGBT 1 can be stabilized by avoiding the erroneous turning off of the IGBT 1. In addition, by adjusting the time constant at the rise of the on/off signal 9S while adjusting the capacitance of the capacitor 12 of the switching speed control means 10, the increase rate $dI_{CO}/dt$ of a main circuit current $I_{CO}$ at the time the IGBT 1 turns off can be controlled, which in turn provides not only an advantage that the forward surge voltage caused in association therewith as well as the erroneous operation of the control circuit can be controlled, but also an advantage that the increase in the gate potential attributable to surge voltage-induced charges can be controlled.

Then, when the on/off signal 9S which is an output of the switching signal source 9, has been switched into an off signal that is high, the npn transistor 11 turns on in response thereto, so that the switching speed control means 10 starts operating. As a result, the base voltage of the npn transistor 3 of the drive circuit 2 starts dropping from $C_{CC}$ to zero while holding such a slope as controlled by the switching speed control means 10. While the base voltage of the npn transistor 3 is dropping, not only a reverse voltage $-V_{BE}$ is applied between the base and emitter of the npn transistor 3 to turn the npn transistor 3 off, but also a forward voltage $V_{BE}$ is applied to the pnp transistor 4 to turn the pnp transistor 4 on, which turns on the gate potential stabilizing npn transistor 20 that is Darlington-connected to the pnp transistor 4 as well. As a result, the gate is virtually short-circuited to the source of the IGBT 1 by the gate potential stabilizing npn transistor 20, which in turn allows the gate potential stabilizing npn transistor 20 to take out the charges stored in the gate of the IGBT 1 by capacitive coupling, causing the gate potential of the IGBT 1 to drop to zero with the same slope as that of the base voltage of the npn transistor 3, so that the IGBT 1 turns off and the main circuit current $I_{CO}$ is thereby blocked. Therefore, in a manner similar to the time the IGBT 1 turns on, the adjustment of the time constant at the fall of the on/off signal 9S while adjusting the capacitance of the capacitor 12 of the switching speed control means 10 allows the main circuit current $I_{CO}$ decreasing speed $-dI_{CO}/dt$ at the time the IGBT 1 turns off to be controlled, thereby providing an advantage that the forward surge voltage caused in association therewith as well as the erroneous operation of the control circuit can be controlled.

Moreover, when the gate potential of the IGBT 1 drops below the threshold voltage thereof after the turning off operation of the IGBT 1 has ended, the comparator 30 of the stable operation extending means 30 turns on to satisfy an AND condition of the gate circuit 33, so that the gate potential stabilizing npn transistor 20 connected thereto turns on. As a result, even if the pnp transistor 4 is turned off, the gate potential stabilizing npn transistor 20 keeps turned on to continue the taking out of the charges stored at the gate by capacitive coupling of the IGBT 1. Therefore, this provides an advantage that an erroneous turning on operation of the IGBT 1 possibly caused by the gate potential rising due to capacitive coupling of the IGBT 1 can be avoided.

Figure 3:
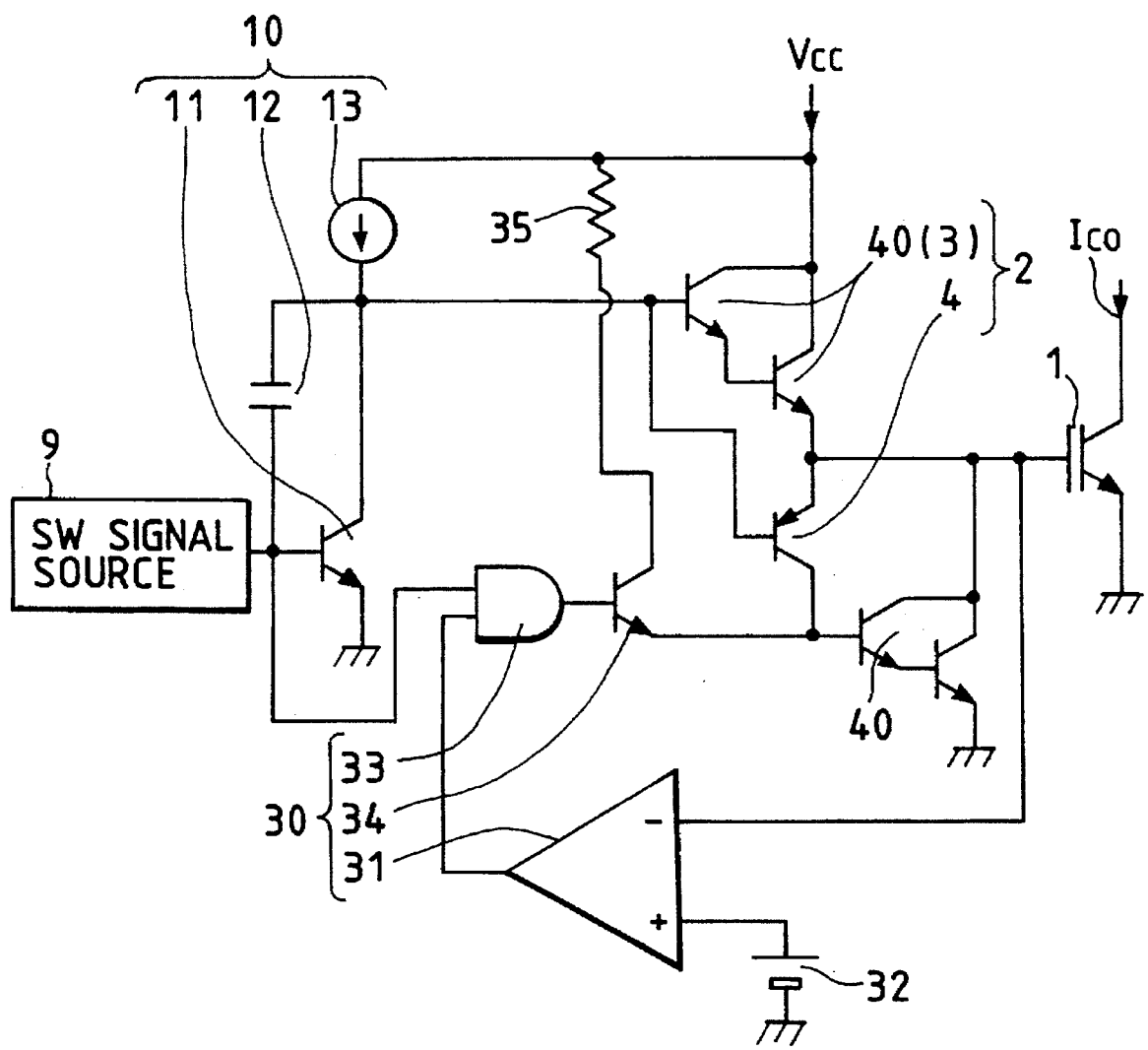
FIG. 3 is a diagram showing in simplified form the configuration of a control circuit for a semiconductor device according to another embodiment of the invention.

FIG. 3 is a diagram showing in simplified form the configuration of a control circuit of a semiconductor device, which is a second embodiment of the invention. The second embodiment is distinguished from the first embodiment in that the npn transistor 3 of the drive circuit 2 and the gate potential stabilizing npn transistor 20 are replaced with Darlington transistors 40, respectively. The thus configured control circuit can not only supply the IGBT 1 with a larger gate current but also facilitate the taking out of the charges stored at the gate while taking advantage of the large dc amplifying rate of the Darlington transistors 40. Therefore, even if the size of the IGBT 1 is increased, not only the slope of a current change at the time the IGBT turns on or off can be kept constant to thereby control the surge voltage, but also an increase in the gate potential due to electrostatic capacitive coupling can be blocked, so that the switching operation of the drive circuit can be stabilized. In addition, the stabilizing function can be extended to the time in which the IGBT is kept turned off while helped by the stabilizing operation extending means.

As described in the foregoing, the invention is characterized as adding a switching speed control means, a gate potential stabilizing npn transistor, and a stable operation extending means to a control circuit that switch-controls an insulated-gate semiconductor device, (e.g., an IGBT), the control circuit having a drive circuit constructed of a series circuit of an npn transistor and a pnp transistor and the insulated-gate semiconductor device having a gate terminal thereof connected to the output of the drive circuit. As a result of this configuration, the slope of a current change can be maintained constant at the time the IGBT turns on and turns off, which in turn contributes to providing an advantage that a large surge voltage generated by the quick current change observed in the conventional art can be controlled and that the breakage of the IGBT and the erroneous operation of the control circuit can be prevented. In addition, the gate potential stabilizing npn transistor opened the way to blocking an increase in gate potential heretofore been caused by the electrostatic capacitive coupling between the high voltage components and the gate during the turning on and off of the IGBT, which in turn contributes to providing an advantage that the unstable switching operation of the drive circuit caused by the increase in gate potential can be eliminated and that the tuning on and off of the IGBT can be stabilized without inviting erroneous operation. Furthermore, since the stable operation extending means can extend the function of the gate potential stabilizing npn transistor for taking the charges out to a period of time in which the IGBT is kept turned off, this contributes to providing an advantage that the erroneous turning on of the IGBT heretofore been caused during the turning off period attributable to the increase in gate potential derived from electrostatic capacitive coupling can be eliminated. Therefore, by using the control circuit of the invention, a semiconductor device with excellent reliability in switching operation such as, e.g., an insulated-gate semiconductor device, can be provided.

What is claimed is:

1. A control circuit for controlling the switching operation of an insulated-gate semiconductor device, comprising:
a switching signal source for generating an on/off signal;
a drive circuit having a series circuit semiconductor which consists of an npn transistor and a pnp transistor, each of said npn transistor and said pnp transistor having a collector connected to a control power supply, a base receiving the on/off signal from said switching signal source, and an emitter outputting an on/off drive voltage, said drive circuit having an output terminal connected to a gate terminal of said semiconductor device; and switching speed control means for supplying the bases of said npn transistor and said pnp transistor of said drive circuit with the on/off signal from said switching signal source while giving predetermined slopes to rise and fall of the on/off signal.

2. A control circuit for controlling the switching operation of a semiconductor device, comprising:

a switching signal source for generating an on/off signal;

a drive circuit having a series circuit semiconductor which consists of an npn transistor and a pnp transistor, each of said npn transistor and said pnp transistor having a collector connected to a control power supply, a base receiving the on/off signal from said switching signal source, and an emitter outputting an on/off drive voltage, said drive circuit having an output terminal connected to a gate terminal of said semiconductor device;

switching speed control means for supplying the bases of said npn transistor and said pnp transistor of said drive circuit with the on/off signal from said switching signal source while giving predetermined slopes to rise and fall of the on/off signal; and a gate potential stabilizing npn transistor being Darlington-connected to said pnp transistor of said drive circuit and having an emitter thereof connected to a source of said semiconductor device.

3. A control circuit as claimed in claim 2, further comprising stable operation extending means for generating an on-command to a base of said gate potential stabilizing npn transistor upon sensing a drop in gate potential of said semiconductor device to a threshold voltage of the gate potential or less.

4. A control circuit as claimed in claim 3, wherein said stable operation extending means includes a comparator, a gate circuit and an npn transistor, said comparator outputting an on signal upon sensing a drop in the gate potential of said semiconductor device to the threshold voltage of the gate potential or less, said gate circuit generating an on signal in response to the on signal from said comparator and an off signal from said switching signal source, said npn transistor turning on in response to the on signal from said gate circuit and outputting a drive signal to said gate potential stabilizing npn transistor.

5. A control circuit as claimed in claim 2, wherein said npn transistor of said drive circuit and said gate potential stabilizing npn transistor are Darlington transistors, respectively.

6. A control circuit for controlling the switching operation of a semiconductor device, comprising:

a switching signal source for generating an on/off signal;

a drive circuit having a series circuit semiconductor which consists of an npn transistor and a pnp transistor, each of said npn transistor and said pnp transistor having a collector connected to a control power supply, a base receiving the on/off signal from said switching signal source and an emitter outputting an on/off drive voltage, said drive circuit having an output terminal connected to a gate terminal of said semiconductor device; and switching speed control means for supplying the bases of said npn transistor and said pnp transistor of said drive circuit with the on/off signal from said switching signal source while giving predetermined slopes to rise and fall of the on/off signal, wherein said switching speed control means includes an npn transistor, a capacitor, and a constant current source, said npn transistor of said switching speed control means having a base thereof connected to said switching signal source and having a collector thereof connected to the bases of said drive circuit, said capacitor being inserted between the collector and the base of said npn transistor of said switching speed control means, said constant current source being inserted between the collector of said npn transistor of said switching speed control means and said control power supply.

* * * * *